(12) United States Patent
Sugihara et al.

(10) Patent No.: US 6,414,334 B2
(45) Date of Patent: Jul. 2, 2002

(54) SEMI-CONDUCTOR DEVICE WITH TEST ELEMENT GROUP FOR EVALUATION OF INTERLAYER DIELECTRIC AND PROCESS FOR PRODUCING THE SAME

(75) Inventors: Tsuyoshi Sugihara; Satoshi Shimizu, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/852,645

(22) Filed: May 11, 2001

(30) Foreign Application Priority Data

Jul. 24, 2000 (JP) .................................... 2000-222469

(51) Int. Cl.[7] .............................................. H01L 29/40
(52) U.S. Cl. ........................................ 257/48; 438/18
(58) Field of Search .................... 257/48, 798; 438/18, 438/14–17, 5–13, 800

(56) References Cited

U.S. PATENT DOCUMENTS 6,005,805 A * 12/1999 Takeuchi ................. 365/185.2

FOREIGN PATENT DOCUMENTS

JP          3-250748        11/1991

* cited by examiner

Primary Examiner—Craig Thompson
(74) Attorney, Agent, or Firm—McDermott, Will & Emery

(57) ABSTRACT

A semiconductor device 10 with Test Element Group (TEG) for estimating an interlayer dielectric includes a memory cell array. The memory cell array includes a semiconductor substrate 1, and a floating gate 2, an interlayer dielectric 3, and a control gate 4, all formed on the substrate 1 in this order. The TEG has the memory cell array similar to semiconductor device subject to estimation for the interlayer dielectric 3. The floating gate 2 has an electrode 5 for estimating the interlayer dielectric 3 provided on at least one side against an elongated direction of the memory cell array.

8 Claims, 6 Drawing Sheets

SEMI-CONDUCTOR DEVICE WITH TEST ELEMENT GROUP FOR EVALUATION OF INTERLAYER DIELECTRIC AND PROCESS FOR PRODUCING THE SAME

FIELD OF THE INVENTION

The present invention relates to a semi-conductor device with a Test Element Group for estimating an interlayer dielectric, and particularly to a semiconductor device having a memory cell array in which a floating gate, an interlayer dielectric, and a control gate are sequentially formed.

BACKGROUND OF THE INVENTION

When an interlayer dielectric formed between a floating gate and control gate is to be evaluated by the Test Element Group (hereunder called "TEG"), a TEG with a flat structure showed in FIG. 5 and a TEG with a floating gate transistor structure showed in FIG. 6 are generally used. FIG. 5A is a sectional view of the TEG with flat structure. FIG. 5B is a plan view of the TEG with flat structure. The TEG with flat structure includes a planar control gate 4 formed on a planar interlayer dielectric 3 that is formed on a planar floating gate 2. Electrodes 5 for estimating the interlayer dielectric 3 are formed on the control gate 4 and the floating gate 2 respectively. When the interlayer 3 is estimated by the TEG with flat structure, certain voltages are applied between the electrodes formed on the control gate and the floating gate 2 within a certain time for accelerated life estimation regarding the dielectric breakdown. In this case, the number of the interlayer dielectric included in the TEG for estimation of interlayer dielectric 3 is calculated by area converting according to an area of the interlayer dielectric 3 within a memory cell in a real semi-conductor. If interlayer dielectric 3 breakdown is occurred, the number of the interlayer dielectric breakdown is calculated by area converting similarly. Then according to the number of the interlayer dielectric breakdown, life estimation per bit of the interlayer dielectric 3 is examined.

FIG. 6A is a perspective sectional view of the TEG with floating gate transistor structure. FIG. 6B is a plan view of the TEG with floating gate transistor structure. The TEG with floating gate transistor structure includes an isolation 6, floating gate 2, interlayer dielectric 3, and control gate 4 that are sequentially formed on a semiconductor substrate 1 in this order. Electrodes 5 of estimating interlayer dielectric 3 are formed on the edge portions of the control gate 4 and the floating gate 2. The estimation of the interlayer dielectric using the TEG with floating gate transistor structure is similar to the estimation using the TEG with flat structure. The life estimation of interlayer dielectric 3 is examined by area converting.

However, a step of the floating gate 2, which is formed in a real semiconductor device, is not formed on an isolation 6 in the TEG with flat structure 30. Then the interlayer dielectric 3 of the TEG with flat structure 30 is formed planar. For this reason, even though interlayer dielectric 3 can be estimated itself, an effectiveness of the step of the interlayer dielectric 3 on the isolation 6 of the real semi-conductor device cannot be ascertained. Similarly, in the TEG with floating gate transistor structure 40, an effectiveness of the step of the interlayer dielectric 3 on the isolation 6 of a real semi-conductor device cannot be ascertained. The resistance component of the floating gate 2 is enlarged because of only one electrode used on the floating gate 2 for estimating the interlayer dielectric 3.

The life estimation of the interlayer dielectric 3 having a large area is examined by the TEG with flat structure 30 and by the TEG with floating gate transistor structure 40. In this case, the areas of the interlayer dielectric 3 in a real semi-conductor device are initially calculated. The life estimation for interlayer dielectric 3 is examined by area converting according to the areas of estimated interlayer dielectric 3 and the areas of the interlayer dielectric 3 in a real semi-conductor device. However the TEG with flat structure 30 and the TEG with floating gate transistor structure 40 don't have a structure in which the floating gate and the interlayer dielectric are separated by a memory cell in a real semi-conductor device. The effect of memory cell structure in a real semiconductor cannot be reflected. The life estimation per bit of the interlayer dielectric 3 is indirectly examined by area converting.

The Japanese Laid-open Patent Publications No. 3-250748 discloses a semi-conductor device that has a device for estimating a film characterization of the insulator film between the floating gate and the control gate. The semiconductor device is used to monitor the film characterization of the insulator film. The accelerated test on the insulator film that has a low probability of defects cannot be performed because the device is useable only for monitoring the film characterization of one insulator film in a cell. If the accelerated test is performed on the insulator film, it is necessary that the areas of the device are enlarged. The accelerated test is therefore indirectly performed by area converting. The estimation is carried out for each memory cell, so that the estimation of the interlayer dielectric 3 tends to be difficultwhere memory cells are arrayed.

SUMMARY OF THE INVENTION

Therefore, it is an object of the present invention to provide a semiconductor device with a TEG for estimating an interlayer dielectric that can estimate an effect of floating gate's structure and the interlayer shape in a real semiconductor device.

Also, it is another object of the present invention to provide a semiconductor with a TEG that can estimate a plurality of interlayer dielectrics in a memory cell array at the same time.

In accordance with one aspect of the present invention, there is provided a semiconductor device with Test Element Group (TEG) for estimating an interlayer dielectric. The semiconductor device with TEG includes a memory cell array. The memory cell array includes a semiconductor substrate, and a floating gate, an interlayer dielectric, and a control gate formed on the substrate in this order. The TEG has a memory cell array similar to the semiconductor device subject to estimation of the interlayer dielectric. The floating gate has an electrode for estimating the interlayer dielectric provided on at least one side against an elongated direction of the memory cell array.

In another aspect of the present invention, the floating gate may be elongated on at least one side against a direction of elongation of the memory cell array for each memory cell.

In a further aspect of the present invention, the floating gate has a dielectric film similar in composition to the interlayer dielectric on the side.

The present invention also provides a process for producing a semiconductor device with TEG for estimating an interlayer dielectric. The process includes the following steps:
S1: forming an isolation on a semiconductor substrate;
S2: forming a floating gate on the semiconductor substrate;
S3: forming an interlayer dielectric on the floating gate;
S4: forming a film for control gate on the interlayer dielectric;

S5: forming a resist pattern on the film for control gate; and
S6: forming a control gate by etching the film for control gate with the resist pattern used as a mask.

Then a memory cell array is constructed by forming the floating gate, the interlayer dielectric, and the control gate formed on the semiconductor substrate in this order.

The step of forming the control gate includes exposing the floating gate by etching the film for control gate. The step of forming the control gate further includes arranging an electrode for estimating the interlayer dielectric on the floating gate, which exists on at least one side against an elongated direction of the memory cell array.

In other aspect of the present invention, the step of forming the control gate includes exposing the floating gate about at least one side against an elongated direction of the memory cell array.

In a yet further aspect of the present invention, the step of forming the control gate includes etching the film for control gate and the interlayer dielectric in this order.

In a yet further aspect of the present invention, the step of forming said control gate may further include of forming a resist pattern and etching the floating gate with the resist or the control gate used as a mask.

The present invention further provides a method of estimating an interlayer dielectric by using the semiconductor device with TEG. The method of estimating an interlayer dielectric includes the following steps.

S1: examining an accelerated life estimation about dielectric breakdown of the interlayer dielectric by certain voltages applied between an electrode provided on the floating gate and an electrode provided on the control gate within a certain time;
S2: detecting the TEG having the dielectric breakdown of the interlayer dielectric within the certain time;
S3: examining a life estimation per bit of the interlayer dielectric, according to the number of bits of the interlayer dielectric included in the TEG having the interlayer dielectric breakdown against the number of bits of the interlayer dielectric included in all Test Element Group.

According to the semiconductor device with TEG of this invention, the TEG has the similar memory cell array to subject to estimation. Therefore the effect of the interlayer dielectric shape, which includes the steps that are occurred by the interlayer dielectric separation, may be examined. The TEG has the memory cell array, so the number of the interlayer dielectric that is included in the TEG having an interlayer dielectric breakdown within the predetermined time can be countable. The life estimation of the interlayer dielectric is examined according to the number of the interlayer dielectric included in the TEG having an interlayer dielectric breakdown against the number of the interlayer dielectric included in all TEG. That is to say, the life estimation per bit of the interlayer dielectric can be directly examined. Since the voltages are applied between a plurality of electrodes provided on the floating gate and the electrode provided on the control gate, the intervals between the electrodes provided on the interlayer dielectric and the floating gate can be reduced. The life estimation can be hardly effected for resistance components of the floating gate.

According to the semiconductor device with TEG of this invention, the floating gate is elongated to at least one side against elongated direction of the memory cell array for each memory cell. Therefore, a plurality of electrodes may be provided on the floating gate easily.

According to the semiconductor device with TEG of this invention, the process for producing the semiconductor device with TEG has no step of removing the interlayer dielectric on the floating gate. Therefore, the semiconductor device with TEG may be simply made.

According to the process of producing the semiconductor device with TEG of this invention, the semiconductor device with TEG may be produced at similar steps of subject to estimation.

According to the process of producing the semiconductor device with TEG of this invention, the floating gate is elongated to at least one side against a direction of elongation of the memory cell array for each memory cell. Therefore, a plurality of electrodes may be provided on the floating gate easily.

According to the process of producing the semiconductor device with TEG of this invention, the interlayer dielectric on the floating gate is etched to remove. Therefore, the electrode may be provided on the floating gate without effect of the interlayer dielectric.

According to the process of producing the semiconductor device with TEG of this invention, the floating gate is formed in a pattern in which the floating gate is elongated to either sides against the memory cell array elongated direction. Therefore, the electrode may be provided on the suitable position of the floating gate.

According to the method of estimating the life estimation of the interlayer dielectric of this invention, the method makes use of the semiconductor device with TEG. The number of the interlayer dielectrics included in the TEG having a dielectric breakdown within the certain time can be countable by bit. Therefore, the life estimation of the interlayer dielectric may be examined according to the ratio of the number of the interlayer dielectric of the dielectric breakdown against the number of the interlayer dielectric included in all TEG. That is to say, the life estimation of the interlayer dielectric can be directly examined per bit, not by area converting.

DETAILED DESCRIPTION OF THE PREFERRED EMBODIMENTS

Figure 1A:
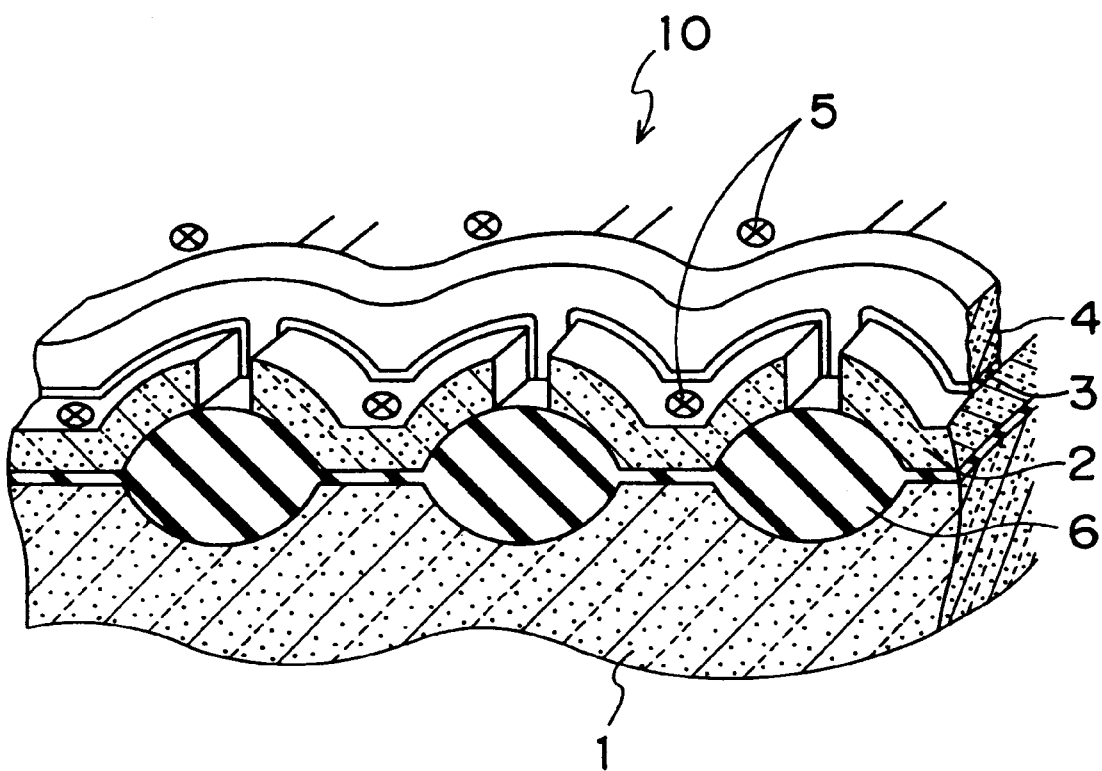
FIG. 1A is a perspective cross-sectional view of the TEG of a first embodiment of the invention.
Figure 1B:
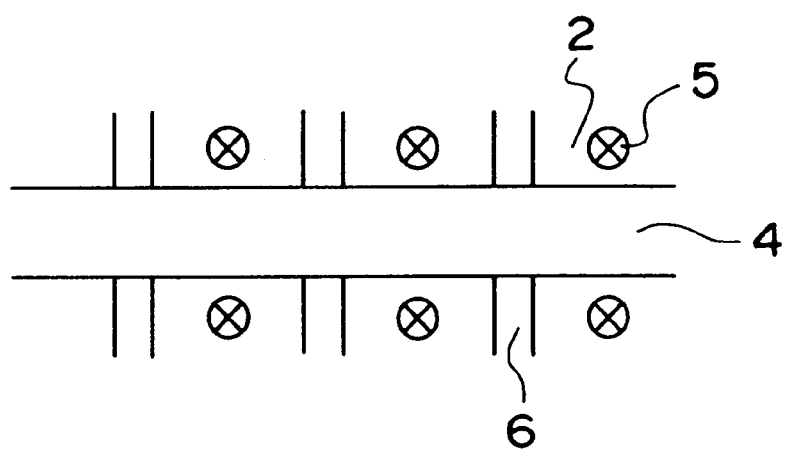
FIG. 1B is a plan view of the TEG of the first embodiment of the invention.
Figure 2:
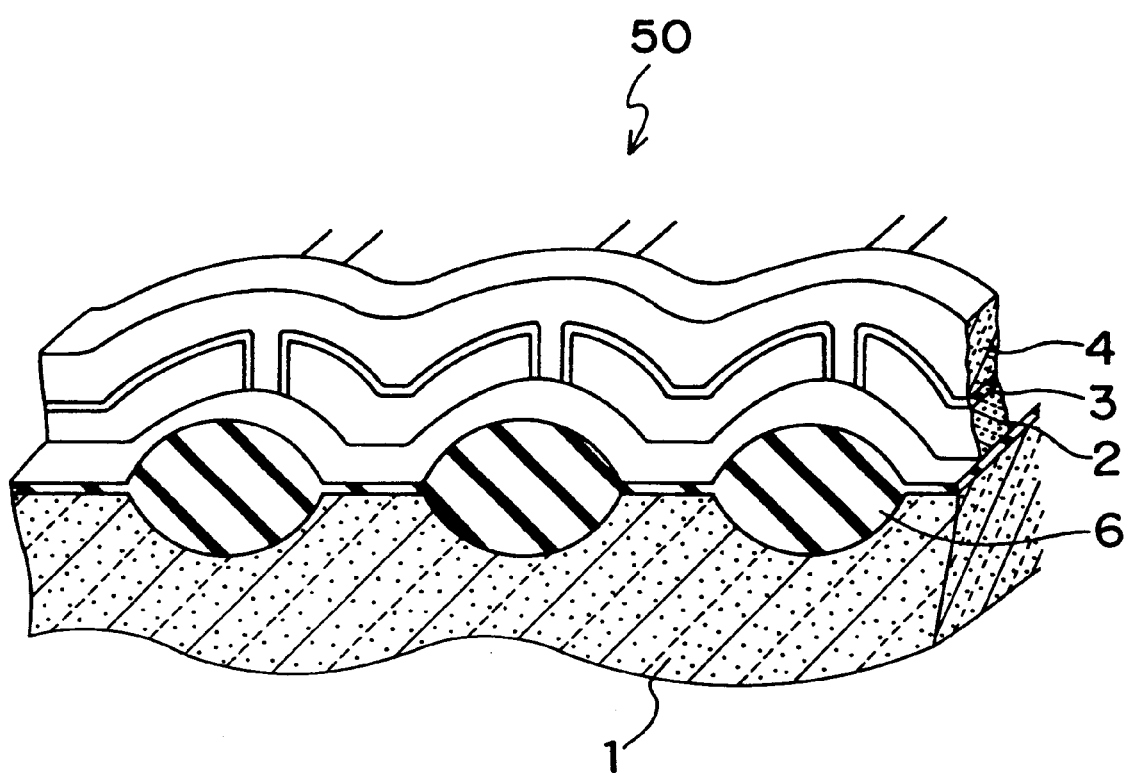
FIG. 2 is a perspective cross-sectional view of the memory cell array in the semiconductor device that is estimated by the TEG of the first embodiment of the invention.

Referring to FIG. 1A, a semiconductor device 10 with TEG for estimating an interlayer dielectric includes an isolation 6, a floating gate 2, an interlayer dielectric 3, and a control gate 4, all of which are formed on a semiconductor substrate 1 in this order. The semiconductor substrate 1 is a silicon substrate. The isolation 6 is a silicon oxide isolation provided by LOCOS (Local Oxidation of Silicon) on the silicon substrate 1. The floating gate 2 is patterned on the silicon oxide isolation. The interlayer dielectric 3 is an ONO film (silicon oxides film/silicon nitrides film/silicon oxides film) formed on the floating gate 2. The control gate 4 is patterned on the interlayer dielectric. The control gate 4 is patterned in a manner similar to the real semiconductor device. The floating gate 2 of this semiconductor device 10 with TEG is elongated to at least one side against the direction of elongation of the memory cell array, but the floating gate of the real semiconductor device is not elongated from the memory cell array. Specifically, a memory cell array is formed under the control gate 4 in a line. The floating gate 4 is elongated to right and left sides from the control gate 4. The electrodes 5 for estimating the interlayer dielectric is provided easily on the floating gate 2 because of the floating gate 2 elongating towards right and left sides from the control gate 4. The floating gate 2 and the interlayer dielectric 3 is separated for each memory cell. Therefore, at least one electrode 5 for estimating the interlayer dielectric 3 is provided on the floating gate 2 elongated in order to estimate the interlayer dielectric 3. It is not necessary that the electrode 5 is provided for each memory cell. The electrode 5 may have a suitable resistance and may be provided on at least an edge of the control gate 4.

The memory cell array may be provided at two dimensions, but not limited to the single line. The memory cell may be arranged in several patterns of array, and to suitable direction. The electrode 5 may be provided on a suitable point of the floating gate 2 and the control gate 4, in order that certain voltages can be applied to the interlayer dielectric 3.

Any dielectric film may be used for the interlayer dielectric 3. For example, a silicon oxide (SiO2) film or a multi-layer of silicon oxide films and silicon nitride films may be used for the interlayer dielectric 3. Preferably, an ONO film (silicon oxides film/silicon nitrides film/silicon oxides film) or NO film (silicon nitrides film/silicon oxides film) etc. are used for the interlayer dielectric 3. The isolation 6 may be provided by various device isolation methods, for example, LOCOS or trench, etc.

The life estimation per bit of the interlayer dielectric 3 can be directly examined by using the semiconductor device 10 with TEG. Specifically, certain voltages are applied between the electrode provided on the control gate 4 and the electrodes provided on the floating gate 2 within the certain time so that the accelerated life estimation about the dielectric breakdown of all interlayer dielectrics 3 included in TEG can be examined. The dielectric breakdown may be detected by a leak judgment. The TEG has a memory cell array so that the number of interlayer dielectric 3 included in the TEG having a dielectric breakdown within the certain time can be countable by bit. Therefore, the life estimation of the interlayer dielectric 3 may be examined according to the ratio of the number of the interlayer dielectric 3 of dielectric breakdown relative to the number of the interlayer dielectric 3 included in all TEG. That is to say, the life estimation of the interlayer dielectric 3 can be directly examined per bit, not by area converting.

The accelerated life estimation about the dielectric breakdown of the interlayer dielectric 3 may be not only the method in which currents are used to judge the dielectric breakdown under voltage stress, but also the method in which voltages are used under current stress. Also, various accelerated life estimation may be examined, for example, dielectric estimation in voltages applied under high temperature may be examined. The TEG having a dielectric breakdown may increase with passage of time. Then, the life estimation of the interlayer dielectric 3 is examined by displaying the probability of error bit of the interlayer dielectric 3 every times, according to accumulating the number of TEG having a dielectric breakdown.

The semiconductor device 10 with TEG includes a memory cell array similar to the real semiconductor device, the electrode 5 for estimating the interlayer dielectric 3 provided on the floating gate 2. The semiconductor device subject to estimation has a memory cell array, in which the floating gate 2 and the interlayer dielectric 3 are separated with the isolation 6 for each memory cell, with steps of the floating gate 2 and the interlayer dielectric 3. The semiconductor device with TEG has a memory cell array similar to the semiconductor device subject to estimation so that the effects of interlayer dielectric 3 shape and the steps can be estimated.

Since the voltages are applied between a plurality of electrodes provided on the floating gate 2 and the electrode provided on the control gate, the intervals between the electrodes provided on the interlayer dielectric 3 and the floating gate 2 can be reduced. The life estimation can be hardly effected for resistance components of the floating gate 2.

Figure 3A:
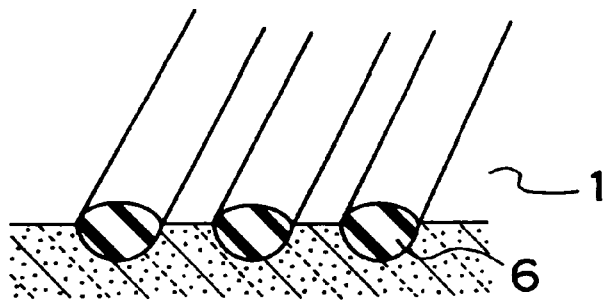
FIGS. 3A to 3D are perspective cross-sectional views of manufacturing steps for making of the semiconductor device with the TEG for estimating the interlayer dielectric.
Figure 3B:
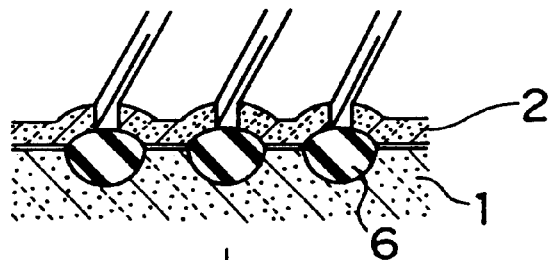
Figure 3C:
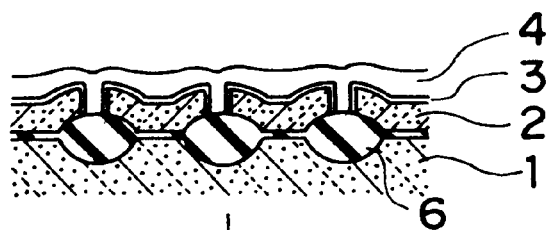
Figure 3D:
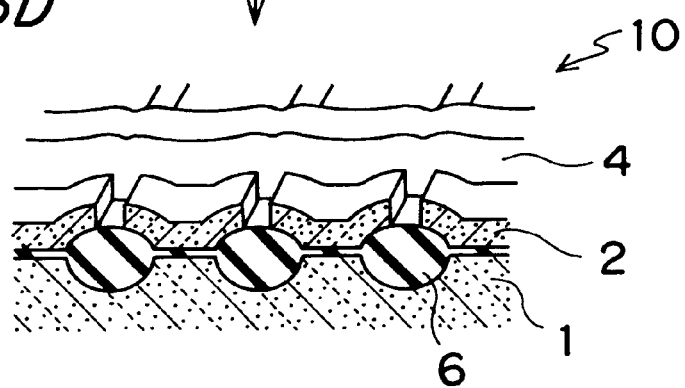

The process for producing the semiconductor device with TEG is now explained hereunder. Referring to FIGS. 3A to 3D, the process for producing the semiconductor device with TEG, includes the steps of:

(a) forming an isolation 6 on a semiconductor substrate 1 (FIG. 3A);

(b) forming a floating gate 2 on the isolation 6 and the semiconductor substrate 1 (FIG. 3B);

(c) forming an interlayer dielectric 3 on the floating gate 2;

(d) forming a film for control gate on the interlayer dielectric 3 (FIG. 3C);

(e) forming a resist pattern on the film for control gate; and (f) forming a control gate by etching the film for control gate with the use of the resist as mask (FIG. 3D).

The isolation 6 may be provided by a process of device isolation, for example, LOCOS or trench. The floating gate 2 may be formed on the semiconductor substrate 1 by a CVD process. Any dielectric film may be used for the interlayer dielectric 3, such as, for example, a silicon oxide (SiO2) film or a multi-layer of silicon oxide films and silicon nitride films may be used for the interlayer dielectric 3. Preferably, an ONO film (silicon oxide film/silicon nitride film/silicon oxides film) or NO film (silicon nitride film/silicon oxide film) etc. are used for the interlayer dielectric 3. The film for the control gate may be formed by a CVD process. The step of forming the control gate includes etching the film for the control gate for exposing the floating gate 2. The step of forming the control gate may further include forming the electrode 5 for estimating the interlayer dielectric on the floating gate 2 that is elongated to at least one side against elongated direction of the memory cell array. Desirably, the electrode may be patterned in order to arrange at a suitable position of the floating gate 2.

Figure 4A:
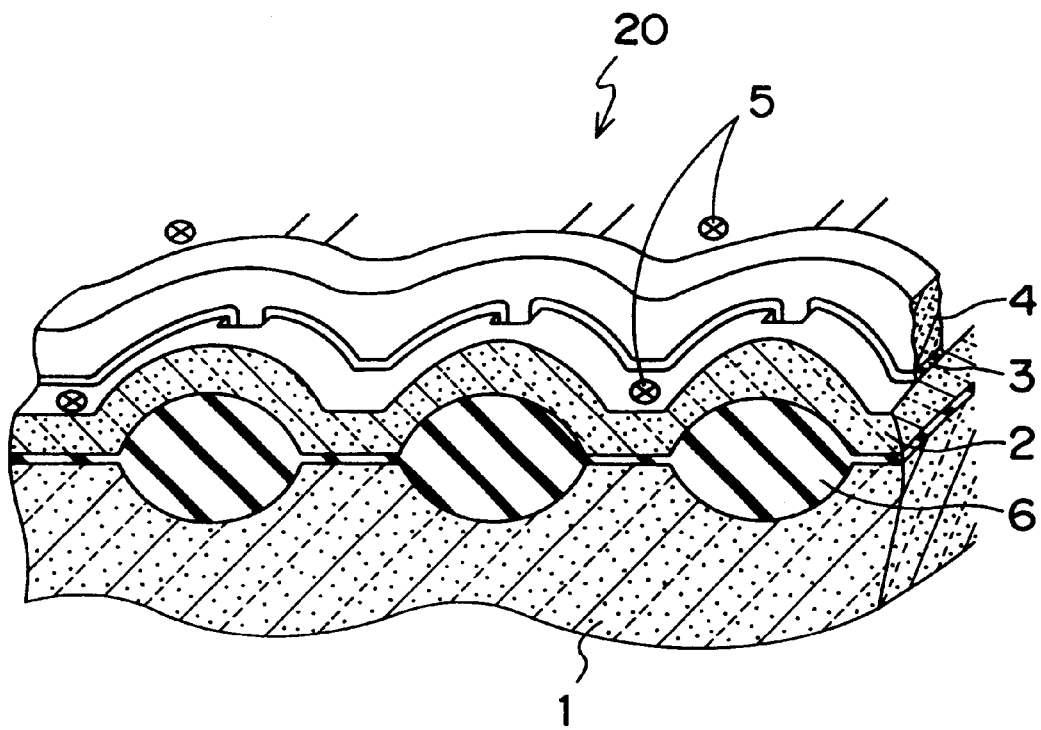
FIG. 4A is a perspective cross-sectional view of the TEG of a second embodiment of the invention.
Figure 4B:
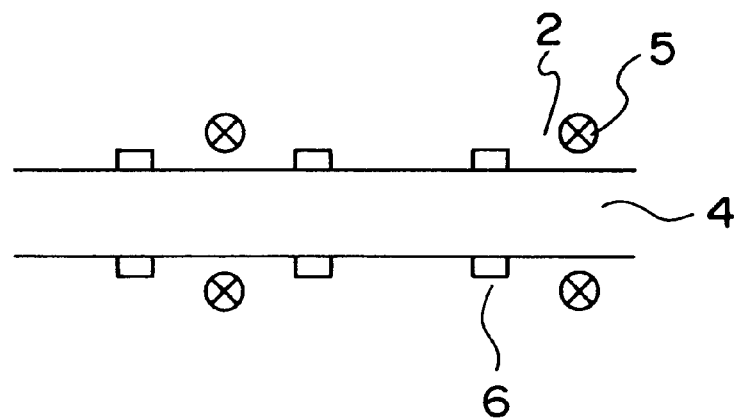
FIG. 4B is a plan view of the TEG of the second embodiment of the invention.
Figure 5A:
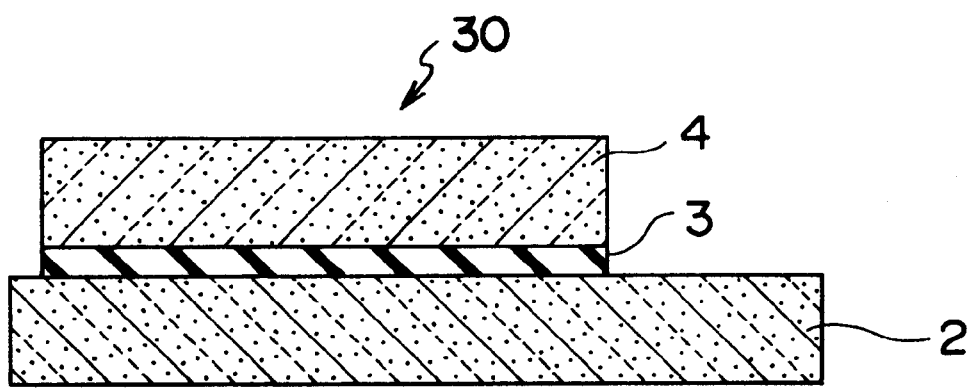
FIG. 5A is a perspective cross-sectional view of the prior art TEG with flat structure.
Figure 5B:
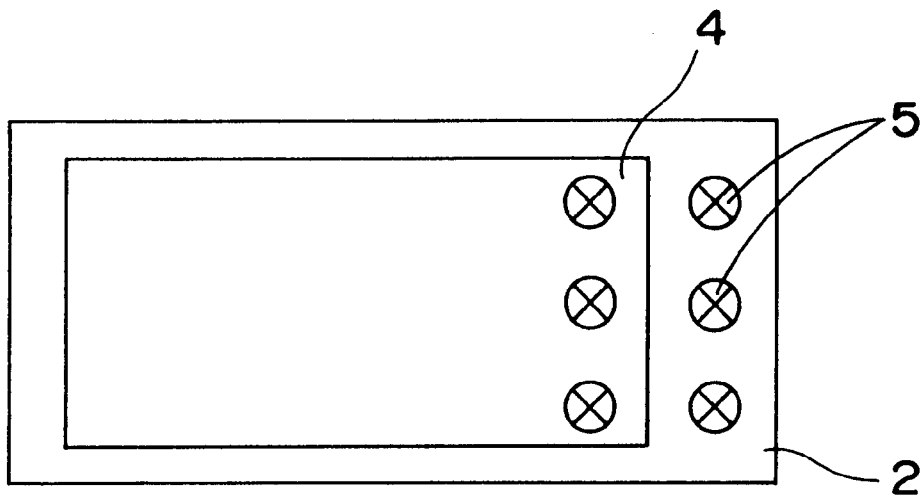
FIG. 5B is a plan view of the prior art TEG with flat structure shown in FIG. 5A.
Figure 6A:
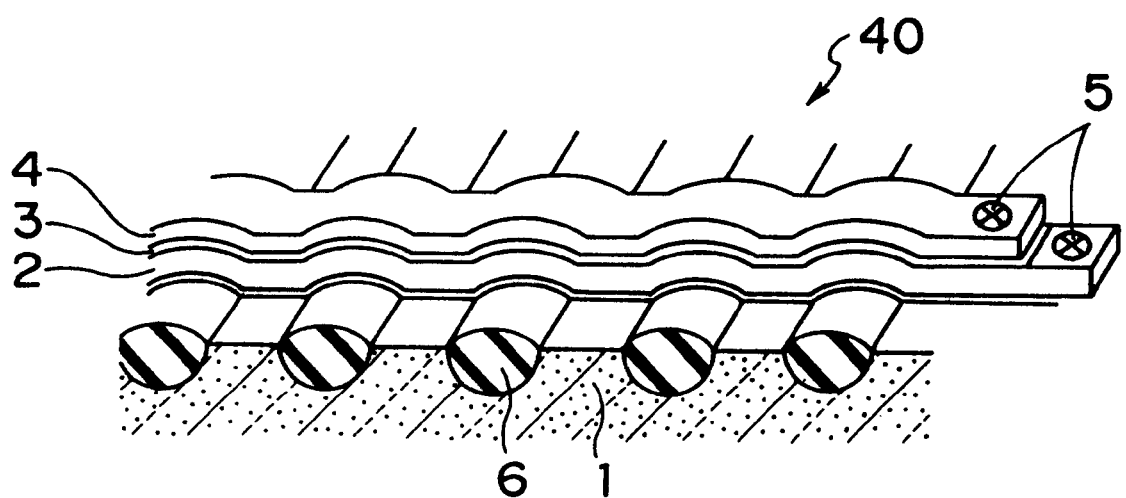
FIG. 6A is a perspective cross-sectional view of the prior art TEG with floating gate transistor structure.
Figure 6B:
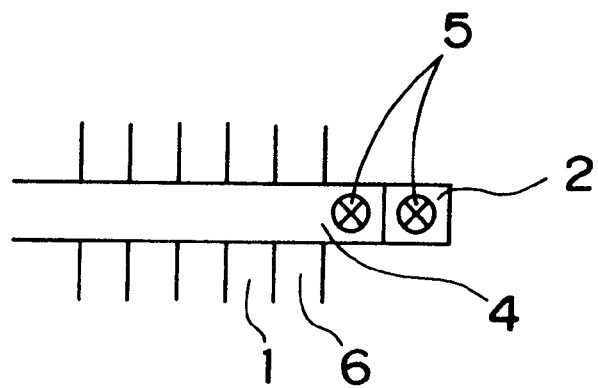
FIG. 6B is a plan view of the prior art TEG with floating gate transistor structure shown in FIG. 6A.

Referring now to FIGS. 4A and 4B pertaining to a second embodiment of the present invention, the semiconductor device 20 with TEG differs from the semiconductor device with TEG of the first embodiment in that in FIG. 4B the floating gate 2, on which the electrode 5 is provided, is not separated partially.

The semiconductor device 20 with TEG for estimating the interlayer dielectric includes an isolation 6, a floating gate 2, an interlayer dielectric 3, and a control gate 4, all formed on a semiconductor substrate 1 in this order. The floating gate 2 is formed in a predetermined pattern. The control gate 4 is formed in a predetermined pattern. The floating gate 2 and the interlayer dielectric 3 are separated for each memory cell as is the case with those in the semiconductor device with TEG of the first embodiment. The floating gate 2, which is elongated to either side from the memory cell array elongated direction, is continuous to each floating gate 2. Therefore, the number of the electrodes 5 provided on the floating gate 2 can be decreased within the limits of the suitable resistance. The floating gate 2 may be formed in a predetermined pattern, which is different from the floating gate 2 of subject to estimation for interlayer dielectric 3. According to the floating gate 2 having the predetermined pattern, the number of electrodes 5 formed on floating gate 2 may be adjusted. After the step of etching the film for control gate, the electrodes position may be adjusted by etching the floating gate 2 in a suitable pattern.

The semiconductor device 20 with TEG can directly examine the life estimation per bit for the interlayer dielectric 3. Specifically, the predetermined voltages are applied between the electrodes provided on the control gate 4 edge and the electrodes provided on the floating gate 2 within the predetermined time, so the accelerated life estimation of all interlayer dielectrics included in the TEG about dielectric breakdown can be examined. The effectiveness of this semiconductor device 20 of the second embodiment is similar to the first embodiment with respect to the life estimation per bit. Further, the semiconductor device 20 with TEG may have various electrodes 5 pattern according to varying the floating gate 2 pattern. Therefore, the life estimation can be directly much easier.

What is claimed is:

1. A semiconductor device with Test Element Group for estimating an interlayer dielectric comprising:
    a memory cell array comprising:
        a semiconductor substrate;
        a floating gate, an interlayer dielectric, and a control gate formed on said substrate in this order;
    wherein said Test Element Group is said memory cell array;
    wherein said floating gate having an electrode for estimating said interlayer dielectric on at least one side against an elongated direction of said memory cell.

2. A semiconductor device with Test Element Group for estimating an interlayer dielectric according to claim 1, wherein said floating gate is elongated on at least one side against a direction of elongation of said memory cell array for each memory cell.

3. A semiconductor device with Test Element Group for estimating an interlayer dielectric according to claim 2, wherein said floating gate has a dielectric film similar in composition to said interlayer dielectric on said side.

4. A process for producing a semiconductor device with Test Element Group for estimating an interlayer dielectric, comprising the steps of:
    forming an isolation on a semiconductor substrate;
    forming a floating gate on said semiconductor substrate;
    forming an interlayer dielectric on said floating gate;
    forming a film for control gate on said interlayer dielectric;
    forming a resist pattern on said film for control gate; and
    forming a control gate by etching said film for control gate with said resist pattern used as a mask,
    whereby a memory cell array is constructed by forming said floating gate, said interlayer dielectric, and said control gate formed on said semiconductor substrate in this order;
    wherein said step of forming said control gate includes the step of exposing said floating gate by etching said film for control gate, and the step of arranging an electrode for estimating said interlayer dielectric on said floating gate, which exists on at least one side against an elongated direction of said memory cell array.

5. A process for producing a semiconductor device with Test Element Group for estimating an interlayer dielectric, according to claim 4, wherein the step of forming said control gate includes the step of exposing said floating gate about at least one side against an elongated direction of said memory cell array.

6. A process for producing a semiconductor device with Test Element Group for estimating an interlayer dielectric, according to claim 4, wherein the step of forming said control gate includes the step of etching said film for control gate and said interlayer dielectric in this order.

7. A process for producing a semiconductor device with Test Element Group for estimating an interlayer dielectric, according to claim 4,
    wherein the step of forming said control gate may further include the step of forming a resist pattern and etching said floating gate with said resist or said control gate used as a mask.

8. A method of estimating an interlayer dielectric by using said semiconductor device with Test Element Group according to claim 1, comprising the steps of:
    examining an accelerated life estimation about dielectric breakdown of said interlayer dielectric by certain voltages applied between an electrode provided on said floating gate and an electrode provided on said control gate within a certain time;
    detecting said Test Element Group having said dielectric breakdown of said interlayer dielectric within said certain time;
    examining a life estimation per bit of said interlayer dielectric, according to the number of bits of said interlayer dielectric included in said Test Element Group having said interlayer dielectric breakdown against the number of bits of said interlayer dielectric included in all Test Element Group.

* * * * *